(12) United States Patent
You et al.

(10) Patent No.: US 12,374,610 B2
(45) Date of Patent: Jul. 29, 2025

(54) SEMICONDUCTOR PACKAGE

(71) Applicant: Samsung Electronics Co., Ltd., Suwon-si (KR)

(72) Inventors: Se-Ho You, Seoul (KR); Ji-Yong Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 507 days.

(21) Appl. No.: 17/903,209

(22) Filed: Sep. 6, 2022

(65) Prior Publication Data
US 2023/0260887 A1 Aug. 17, 2023

(30) Foreign Application Priority Data
Feb. 15, 2022 (KR) .................. 10-2022-0019275

(51) Int. Cl.
*H01L 25/065* (2023.01)
*H01L 23/00* (2006.01)
*H01L 23/498* (2006.01)

(52) U.S. Cl.
CPC ............. *H01L 23/49833* (2013.01); *H01L 23/49816* (2013.01); *H01L 23/49838* (2013.01); *H01L 24/16* (2013.01); *H01L 25/0655* (2013.01); *H01L 24/32* (2013.01); *H01L 24/73* (2013.01); *H01L 2224/16137* (2013.01); *H01L 2224/16227* (2013.01); *H01L 2224/32137* (2013.01); *H01L 2224/73203* (2013.01); *H01L 2924/1431* (2013.01); *H01L 2924/1434* (2013.01); *H01L 2924/1511* (2013.01); *H01L 2924/15151* (2013.01)

(58) Field of Classification Search
CPC .......... H01L 25/0655; H01L 23/49833; H01L 24/73
See application file for complete search history.

(56) References Cited

U.S. PATENT DOCUMENTS

| 7,964,953 | B2 | 6/2011 | Kim |
| 9,059,179 | B2 | 6/2015 | Karikalan et al. |
| 10,418,329 | B2 | 9/2019 | Li et al. |
| 10,763,216 | B2 | 9/2020 | Braunisch et al. |
| 11,025,411 | B2 | 6/2021 | Guim Bernat et al. |
| 11,030,017 | B2 | 6/2021 | Kumar et al. |
| 2009/0134510 | A1* | 5/2009 | Kim ............ H01L 25/105 257/E21.575 |

(Continued)

*Primary Examiner* — Errol V Fernandes
(74) *Attorney, Agent, or Firm* — Harness, Dickey & Pierce, P.L.C.

(57) ABSTRACT

A semiconductor package includes a first substrate including a first wiring layer inside the first substrate, a second substrate including a second wiring layer inside the second substrate, and a mold layer between the first substrate and the second substrate. An upper surface of the mold layer is on a same plane as upper surfaces of the first substrate and the second substrate. The package includes a first connecting film on each of the upper surface of the first substrate and the upper surface of the second substrate, the first connecting film connecting the first substrate and the second substrate, and a first semiconductor chip on the upper surface of the first substrate. The first semiconductor chip is spaced apart from the first connecting film, and an upper surface of the first connecting film is lower than an upper surface of the first semiconductor chip.

20 Claims, 15 Drawing Sheets

(56) References Cited

U.S. PATENT DOCUMENTS

| | | | |
|---|---|---|---|
| 2009/0166841 A1* | 7/2009 | Hsu | H01L 23/5389 |
| | | | 257/690 |
| 2015/0035142 A1* | 2/2015 | Kim | H01L 23/49822 |
| | | | 257/737 |
| 2018/0294216 A1* | 10/2018 | Kim | H01L 25/50 |
| 2019/0287908 A1 | 9/2019 | Dogiamis et al. | |
| 2020/0294920 A1 | 9/2020 | Hariri et al. | |
| 2020/0294940 A1* | 9/2020 | Dogiamis | H01P 11/001 |
| 2021/0111141 A1 | 4/2021 | Sauter et al. | |

* cited by examiner

SEMICONDUCTOR PACKAGE

CROSS-REFERENCE TO RELATED APPLICATION

This application claims priority from Korean Patent Application No. 10-2022-0019275 filed on Feb. 15, 2022 in the Korean Intellectual Property Office and all the benefits accruing therefrom under 35 U.S.C. 119, the contents of which in its entirety are herein incorporated by reference.

FIELD

The present inventive concepts relate to a semiconductor package.

BACKGROUND

In recent years, as implementation of high-performance elements has been desired or required, a size of a semiconductor chip has increased, and therefore a size of a semiconductor package has increased. On the other hand, the thickness of the semiconductor package is rather decreasing according to a slimming tendency of the electronic device.

On the other hand, the semiconductor package is being developed to satisfy the demands for multi-functionality, high capacity, and miniaturization. For this reason, by incorporating a plurality of semiconductor chips into a single semiconductor package, a high capacity and multiple functions may be performed, while significantly reducing the size of the semiconductor package.

In the related art, a chip-let technique for mounting a plurality of semiconductor chips on the single package substrate has been applied. When manufacturing a semiconductor package by the chip-let technique, the size of the package substrate may increase and the design rule of the package substrate may be complicated. Therefore, there are problems of an increase in difficulty level of the manufacturing process of the semiconductor package and an increase in manufacturing cost.

SUMMARY

Some example embodiments of the present inventive concepts provide a semiconductor package that simplifies a process of connecting a plurality of substrates and reduces a process cost, by connecting a plurality of substrates to each other using a plurality of connecting films to connect the plurality of substrates having different sizes or functions, before attachment to a board.

According to some example embodiments of the present inventive concepts, a semiconductor package includes a first substrate including a first wiring layer inside the first substrate, a second substrate including a second wiring layer inside the second substrate, the second substrate spaced apart from the first substrate in a first horizontal direction, and a mold layer between the first substrate and the second substrate, an upper surface of the mold layer on a same plane as each of an upper surface of the first substrate and an upper surface of the second substrate. The package includes a first connecting film on each of the upper surface of the first substrate and the upper surface of the second substrate, the first connecting film connecting the first substrate and the second substrate, and a first semiconductor chip on the upper surface of the first substrate, the first semiconductor chip spaced apart from the first connecting film, and an upper surface of the first connecting film lower than an upper surface of the first semiconductor chip.

According to some example embodiments of the present inventive concepts, a semiconductor package includes a first substrate including a first wiring layer inside the first substrate, a second substrate including a second wiring layer inside the second substrate, the second substrate spaced apart from the first substrate in a first horizontal direction, a third substrate including a third wiring layer inside the third substrate, the third substrate spaced apart from the first substrate in a second horizontal direction, the second horizontal direction different from the first horizontal direction, and a fourth substrate including a fourth wiring layer inside the fourth substrate, the fourth substrate spaced apart from the second substrate in the second horizontal direction. The package includes a mold layer between each of the first to fourth substrates, a first connecting film on each of an upper surface of the first substrate and an upper surface of the second substrate, the first connecting film connecting the first substrate and the second substrate, a second connecting film on each of the upper surface of the first substrate and an upper surface of the third substrate, the second connecting film connecting the first substrate and the third substrate, and a third connecting film on each of the upper surface of the second substrate and an upper surface of the fourth substrate, the third connecting film connecting the second substrate and the fourth substrate. The package includes a semiconductor chip on at least one of the upper surfaces of the first to fourth substrates, the semiconductor chip spaced apart from each of the first to third connecting films, wherein an upper surface of the mold layer is on a same plane as the upper surfaces of each of the first to fourth substrates.

According to some example embodiments of the present inventive concepts, a semiconductor package including a first substrate including a first wiring layer inside the first substrate, a second substrate including a second wiring layer inside the second substrate, the second substrate spaced apart from the first substrate, and a third substrate including a third wiring layer inside the third substrate, the third substrate spaced apart from each of the first and second substrates. The package includes a mold layer between each of the first to third substrates, the mold layer including an upper surface on a same plane as upper surfaces of each of the first to third substrates, a first connecting film on each of the upper surface of the first substrate, the upper surface of the mold layer and the upper surface of the second substrate, the first connecting film connecting the first substrate and the second substrate, and a second connecting film on each of the upper surface of the first substrate, the upper surface of the mold layer and the upper surface of the third substrate, the second connecting film connecting the first substrate and the third substrate.

However, example embodiments of the present inventive concepts are not limited to the ones set forth herein. The above and other example embodiments of the present inventive concepts will become more apparent by referencing the detailed description of the present inventive concepts given below.

BRIEF DESCRIPTION OF THE DRAWINGS

The above and other example embodiments and features of the present inventive concepts will become more apparent by describing in detail example embodiments thereof referring to the attached drawings, in which.

DETAILED DESCRIPTION

Hereinafter, a semiconductor package according to some example embodiments of the present disclosure will be described referring to FIGS. 1 to 3.

Figure 1:
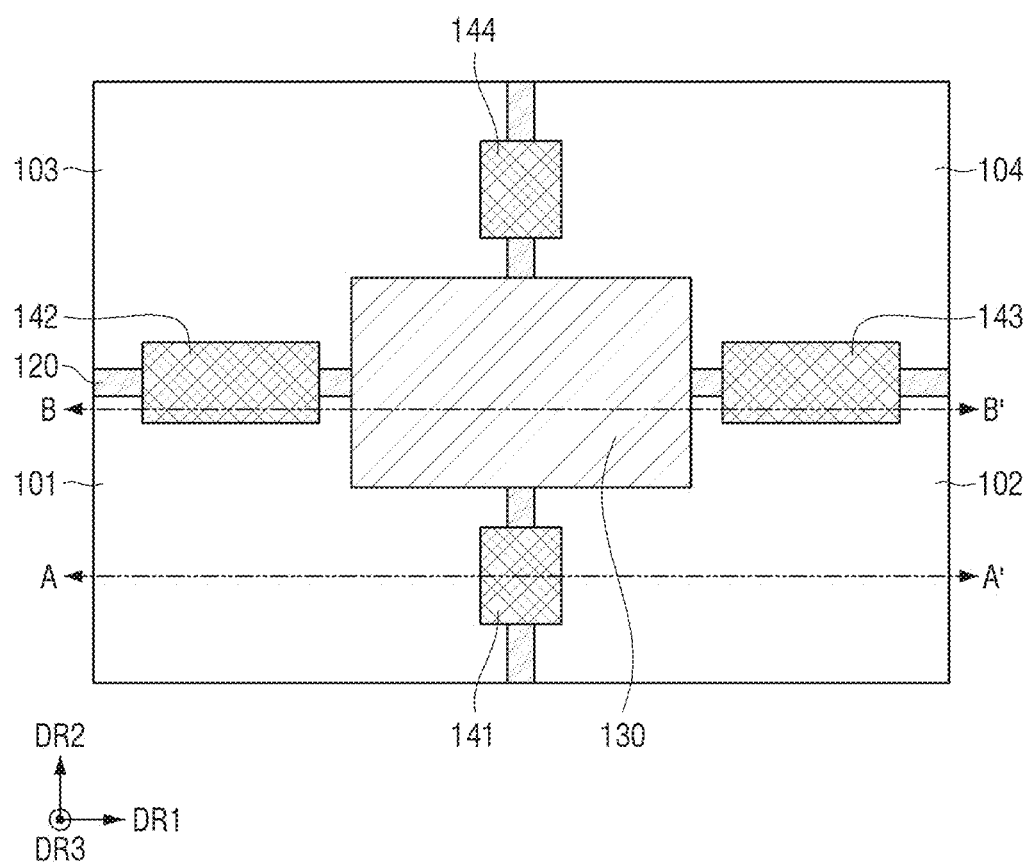
FIG. 1 is a top view for explaining a semiconductor package according to some example embodiments of the inventive concepts.

FIG. 1 is a top view for explaining a semiconductor package according to some example embodiments of the inventive concepts. FIG. 2 is a cross-sectional view taken along a line A-A' of FIG. 1. FIG. 3 is a cross-sectional view taken along a line B-B' of FIG. 1.

The semiconductor package to be described below is related to a chip-let technique for mounting a plurality of semiconductor chips on a single substrate, and a package-let technique for connecting a plurality of other substrates. Referring to FIGS. 1 to 3, the semiconductor package according to some example embodiments of the present inventive concepts includes first to fourth substrates 101, 102, 103 and 104, a first wiring layer 111, a second wiring layer 112, a mold layer 120, a first semiconductor chip 130, first to fourth connecting films 141, 142, 143 and 144, and first to third solder balls 151, 152 and 153.

Each of the first to fourth substrates 101, 102, 103 and 104 may be, for example, a printed circuit board (PCB) or a ceramic substrate. However, example embodiments are not limited thereto.

When each of the first to fourth substrates 101, 102, 103 and 104 is a printed circuit board, the first to fourth substrates 101, 102, 103 and 104 may each be made of at least one material selected from phenol resin, epoxy resin, and polyimide. For example, each of the first to fourth substrates 101, 102, 103 and 104 may include at least one material selected from FR4, tetrafunctional epoxy, polyphenylene ether, epoxy/polyphenylene oxide, BT (bismaleimide triazine), thermount, cyanate ester, polyimide, and liquid crystal polymer, but example embodiments are not limited thereto.

A second substrate 102 may be spaced apart from the first substrate 101 in a first horizontal direction DR1. A third substrate 103 may be spaced apart from the first substrate 101 in a second horizontal direction DR2 different from the first horizontal direction DR1. The fourth substrate 104 may be spaced apart from the third substrate 103 in the first horizontal direction DR1. Further, a fourth substrate 104 may be spaced apart from the second substrate 102 in the second horizontal direction DR2.

For example, upper surfaces of each of the first to fourth substrates 101, 102, 103, and 104 may be formed on the same or substantially the same plane as each other. Further, lower surfaces of each of the first to fourth substrates 101, 102, 103, and 104 may be formed on the same or substantially the same plane as each other. However, example embodiments are not limited thereto.

Although each of the first to fourth substrates 101, 102, 103 and 104 is shown to have the same or substantially the same area and shape on a plane in FIG. 1, this is for convenience of explanation, and the areas and shapes of each of the first to fourth substrates 101, 102, 103, and 104 are not limited thereto. For example, at least one of the first to fourth substrates 101, 102, 103 and 104 may have an area and a shape different from those of the other substrates.

A first wiring layer 111 may be disposed inside the first substrate 101. The first wiring layer 111 may include a plurality of wirings spaced apart from each other in each of the first horizontal direction DR1 and the second horizontal direction DR2. Further, the first wiring layer 111 may include a plurality of wirings spaced apart from each other in a vertical direction DR3 perpendicular or substantially perpendicular to each of the first and second horizontal directions DR1 and DR2. The first wiring layer 111 may include a conductive material.

The second wiring layer 112 may be disposed inside the second substrate 102. The second wiring layer 112 may include a plurality of wings spaced apart from each other in each of the first horizontal direction DR1 and the second horizontal direction DR2. Further, the second wiring layer 112 may include a plurality of wirings spaced apart from each other in the vertical direction DR3. The second wiring layer 112 may include a conductive material.

A third wiring layer (not shown) may be disposed inside the third substrate 103. The third wiring layer (not shown) may include a plurality of wirings spaced apart from each other in each of the first horizontal direction DR1 and the second horizontal direction DR2. Further, the third wiring layer (not shown) may include a plurality of wirings spaced apart from each other in the vertical direction DR3. The third wiring layer (not shown) may include a conductive material.

A fourth wiring layer (not shown) may be disposed inside the fourth substrate 104. The fourth wiring layer (not shown) may include a plurality of wirings spaced apart from each other in each of the first horizontal direction DR1 and the second horizontal direction DR2. Further, the fourth wiring layer (not shown) may include a plurality of wirings spaced apart from each other in the vertical direction DR3. The fourth wiring layer (not shown) may include a conductive material.

A first solder ball 151 may be disposed on the lower surfaces of each of the first to fourth substrates 101, 102, 103, and 104. For example, the first solder ball 151 may be in contact with each of the first wiring layer 111 exposed on a lower surface 101*b* of the first substrate 101, the second wiring layer 112 exposed on a lower surface 102*b* of the second substrate 102, the third wiring layer (not shown) exposed on a lower surface of the third substrate 103, and the fourth wiring layer (not shown) exposed on a lower surface of the fourth substrate 104.

The first solder ball 151 may be a portion by which each of the first to fourth substrates 101, 102, 103, and 104 is electrically connected to another element. The first solder ball 151 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, but example embodiments are not limited thereto.

The mold layer 120 may be disposed between each of the first to fourth substrates 101, 102, 103 and 104. That is, the mold layer 120 may be disposed between the first substrate 101 and the second substrate 102, between the first substrate 101 and the third substrate 103, between the second substrate 102 and the fourth substrate 104, and between the third substrate 103 and the fourth substrate 104.

For example, an upper surface of the mold layer 120 may be formed on the same or substantially the same plane as each of an upper surface 101*a* of the first substrate 101, an upper surface 102*a* of the second substrate 102, an upper surface of the third substrate 103, and an upper surface of the fourth substrate 104. A lower surface of the mold layer 120 may be formed on the same or substantially the same plane as each of a lower surface 101*b* of the first substrate 101, a lower surface 102*b* of the second substrate 102, a lower surface of the third substrate 103, and a lower surface of the fourth substrate 104. The mold layer 120 may include, for example, an epoxy molding compound (EMC) or two or more types of silicone hybrid materials. However, example embodiments are not limited thereto.

The first semiconductor chip 130 may be disposed on the upper surface of at least one of the first to fourth substrates 101, 102, 103 and 104. For example, the first semiconductor chip 130 may overlap each of the first to fourth substrates 101, 102, 103, and 104 in the vertical direction DR3. The first semiconductor chip 130 may be, for example, a logic semiconductor chip. The first semiconductor chip 130 may be a micro-processor. The first semiconductor chip 130 may be, for example, a central processing unit (CPU), a controller, or an application specific integrated circuit (ASIC), but example embodiments are not limited thereto.

Further, the first semiconductor chip 130 may be, for example, an HBM semiconductor chip. For example, the first semiconductor chip 130 may include a plurality of stacked memory semiconductor chips. Each of the plurality of memory semiconductor chips may be, for example, a volatile memory semiconductor chip such as a DRAM (dynamic random access memory) or a SRAM (static random access memory), or a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory). However, example embodiments are not limited thereto.

A third solder ball 153 may be disposed between each of the first to fourth substrates 101, 102, 103 and 104 and the first semiconductor chip 130. For example, the third solder ball 153 may be in contact with each of the first wiring layer 111 exposed on the upper surface 101*a* of the first substrate 101, the second wiring layer 112 exposed on the upper surface 102*a* of the second substrate 102, a third wiring layer (not shown) exposed on the upper surface of the third substrate 103, and a fourth wiring layer (not shown) exposed on the upper surface of the fourth substrate 104. Further, the third solder ball 153 may be in contact with the lower surface of the first semiconductor chip 130.

For example, the first semiconductor chip 130 may be electrically connected to each of the first to fourth substrates 101, 102, 103 and 104 through the third solder ball 153. Although the third solder ball 153 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

A first connecting film 141 may be disposed on the upper surface 101*a* of the first substrate 101, the upper surface of the mold layer 120, and the upper surface 102*a* of the second substrate 102. The first connecting film 141 may overlap at least a part of the first substrate 101 adjacent to the second substrate 102 in the vertical direction DR3. The first connecting film 141 may overlap at least a part of the second substrate 102 adjacent to the first substrate 101 in the vertical direction DR3. The first connecting film 141 may overlap the mold layer 120 disposed between the first substrate 101 and the second substrate 102 in the vertical direction DR3.

The first connecting film 141 may be connected between the first substrate 101 and the second substrate 102. The first connecting film 141 may be connected to the first substrate 101 and the second substrate 102 through a second solder ball 152. Although the second solder ball 152 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

For example, the first connecting film 141 may be electrically connected between the first substrate 101 and the second substrate 102 through the second solder ball 152. In this case, the first connecting film 141 may include a conductive material. However, example embodiments are not limited thereto.

An upper surface 141*a* of the first connecting film 141 may be formed to be lower than the upper surface 130*a* of the first semiconductor chip 130. That is, the upper surface 141*a* of the first connecting film 141 may be formed to be closer to each of the upper surface 101*a* of the first substrate 101 and the upper surface 102*a* of the second substrate 102 than the upper surface 130*a* of the first semiconductor chip 130.

The second connecting film 142 may be disposed on the upper surface 101*a* of the first substrate 101, the upper surface of the mold layer 120, and the upper surface of the third substrate 103. The second connecting film 142 may overlap at least a part of the first substrate 101 adjacent to the third substrate 103 in the vertical direction DR3. The second connecting film 142 may overlap at least a part of the third substrate 103 adjacent to the first substrate 101 in the vertical direction DR3. The second connecting film 142 may overlap the mold layer 120 disposed between the first substrate 101 and the third substrate 103 in the vertical direction DR3.

The second connecting film 142 may be connected between the first substrate 101 and the third substrate 103. The second connecting film 142 may be connected to the first substrate 101 and the third substrate 103 through the second solder ball 152. For example, the second connecting film 142 may be electrically connected between the first substrate 101 and the third substrate 103 through the second solder ball 152. In this case, the second connecting film 142 may include a conductive material. However, example embodiments are not limited thereto.

An upper surface 142a of the second connecting film 142 may be formed to be lower than the upper surface 130a of the first semiconductor chip 130. That is, the upper surface 142a of the second connecting film 142 may be formed to be closer to each of the upper surface 101a of the first substrate 101 and the upper surface of the third substrate 103 than the upper surface 130a of the first semiconductor chip 130.

A third connecting film 143 may be disposed on the upper surface 102a of the second substrate 102, the upper surface of the mold layer 120, and the upper surface of the fourth substrate 104. The third connecting film 143 may overlap at least a part of the second substrate 102 adjacent to the fourth substrate 104 in the vertical direction DR3. The third connecting film 143 may overlap at least a part of the fourth substrate 104 adjacent to the second substrate 102 in the vertical direction DR3. The third connecting film 143 may overlap the mold layer 120 disposed between the second substrate 102 and the fourth substrate 104 in the vertical direction DR3.

The third connecting film 143 may be connected between the second substrate 102 and the fourth substrate 104. The third connecting film 143 may be connected to the second substrate 102 and the fourth substrate 104 through the second solder ball 152. For example, the third connecting film 143 may be electrically connected between the second substrate 102 and the fourth substrate 104 through the second solder ball 152. In this case, the third connecting film 143 may include a conductive material. However, example embodiments are not limited thereto.

An upper surface 143a of the third connecting film 143 may be formed to be lower than the upper surface 130a of the first semiconductor chip 130. That is, the upper surface 143a of the third connecting film 143 may be formed to be closer to each of the upper surface 102a of the second substrate 102 and the upper surface of the fourth substrate 104 than the upper surface 130a of the first semiconductor chip 130.

A fourth connecting film 144 may be disposed on the upper surface of the third substrate 103, the upper surface of the mold layer 120, and the upper surface of the fourth substrate 104. The fourth connecting film 144 may overlap at least a part of the third substrate 103 adjacent to the fourth substrate 104 in the vertical direction DR3. The fourth connecting film 144 may overlap at least a part of the fourth substrate 104 adjacent to the third substrate 103 in the vertical direction DR3. The fourth connecting film 144 may overlap the mold layer 120 disposed between the third substrate 103 and the fourth substrate 104 in the vertical direction DR3.

The fourth connecting film 144 may be connected between the third substrate 103 and the fourth substrate 104. The fourth connecting film 144 may be connected to the third substrate 103 and the fourth substrate 104 through the second solder ball 152. For example, the fourth connecting film 144 may be electrically connected between the third substrate 103 and the fourth substrate 104 through the second solder ball 152. In this case, the fourth connecting film 144 may include a conductive material. However, example embodiments are not limited thereto.

An upper surface of the fourth connecting film 144 may be formed to be lower than the upper surface 130a of the first semiconductor chip 130. That is, the upper surface of the fourth connecting film 144 may be formed to be closer to each of the upper surface of the third substrate 103 and the upper surface of the fourth substrate 104 than the upper surface 130a of the first semiconductor chip 130.

For example, each of the first to fourth connecting films 141, 142, 143 and 144 may be spaced apart from the first semiconductor chip 130. For example, each of the first to fourth connecting films 141, 142, 143 and 144 may be spaced apart from each other. For example, the third connecting film 143 may be separated from the second connecting film 142 in the first horizontal direction DR1. Further, the fourth connecting film 144 may be spaced apart from the first connecting film 141 in the second horizontal direction DR2.

Although FIG. 1 shows that the planar shapes of each of the first to fourth connecting films 141, 142, 143, and 144 have a rectangular shape, this is for convenience of explanation, and the shapes of each of the first to fourth connecting films 141, 142, 143, and 144 are not limited thereto.

In some other example embodiments, each of the first to fourth connecting films 141, 142, 143 and 144 may include an insulating material, for example, polyimide. In this case, the first to fourth connecting films 141, 142, 143 and 144 physically connect each of the first to fourth substrates 101, 102, 103 and 104 to each other, and electrically insulate each of the first to fourth substrates 101, 102, 103 and 104 from each other.

A semiconductor package according to some example embodiments of the present inventive concepts may electively connect a plurality of substrates 101, 102, 103 and 104 having different sizes or functions from each other, by connecting the plurality of substrates 101, 102, 103 and 104 using a plurality of connecting films 141, 142, 143 and 144 before attachment to the board. This makes it possible to simplify the process of connecting the plurality of substrates 101, 102, 103 and 104, and reduce the process cost.

Hereinafter, a method for manufacturing a semiconductor package according to some example embodiments of the present inventive concepts will be described referring to FIGS. 2 to 10.

FIGS. 4 to 10 are intermediate step diagrams for explaining a method for manufacturing a semiconductor package according to some example embodiments of the present inventive concepts.

Figure 4:
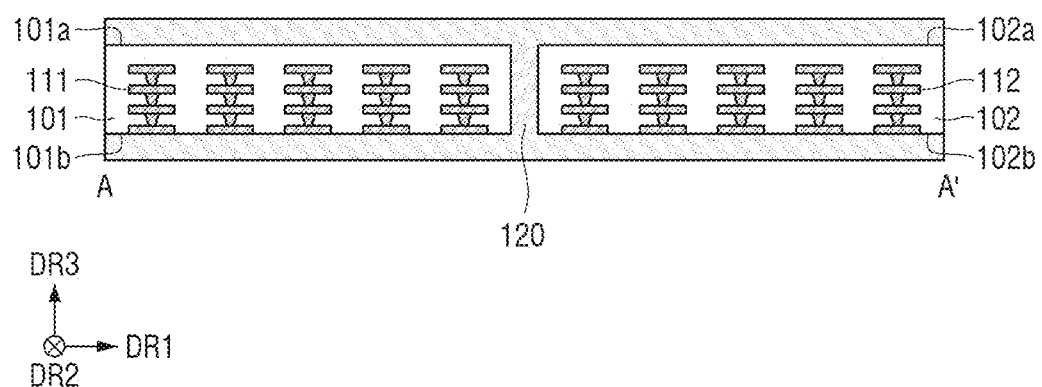
FIGS. 4, 5, 6, 7, 8, 9 and 10 are intermediate step diagrams for explaining a method for manufacturing a semiconductor package according to some example embodiments of the present inventive concepts.
Figure 5:
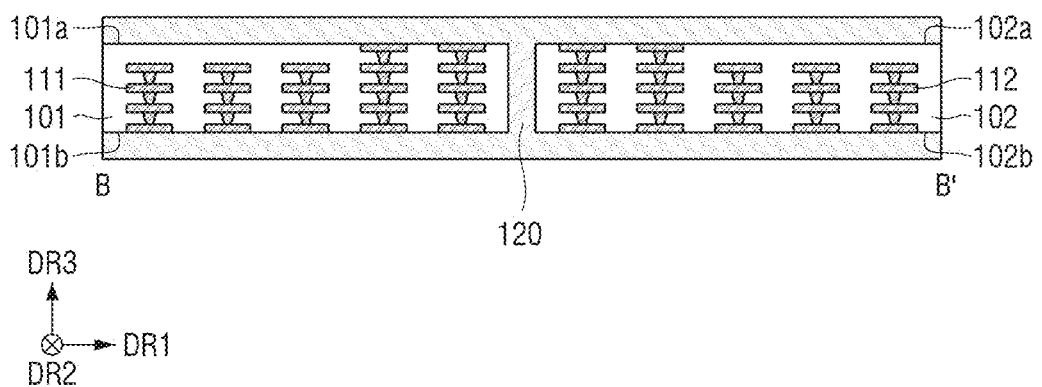

Hereinafter, the manufacturing method will be explained by way of an example embodiment, on the basis of the cross sections of the first substrate 101 and the second substrate 102. Referring to FIGS. 4 and 5, the first substrate 101 and the second substrate 102 spaced apart from each other may be provided. Subsequently, the mold layer 120 may be formed to cover each of the upper surface 101a and the lower surface 101b of the first substrate 101, and the upper surface 102a and the lower surface 102b of the second substrate 102. The mold layer 120 may also be formed between the first substrate 101 and the second substrate 102.

Figure 6:
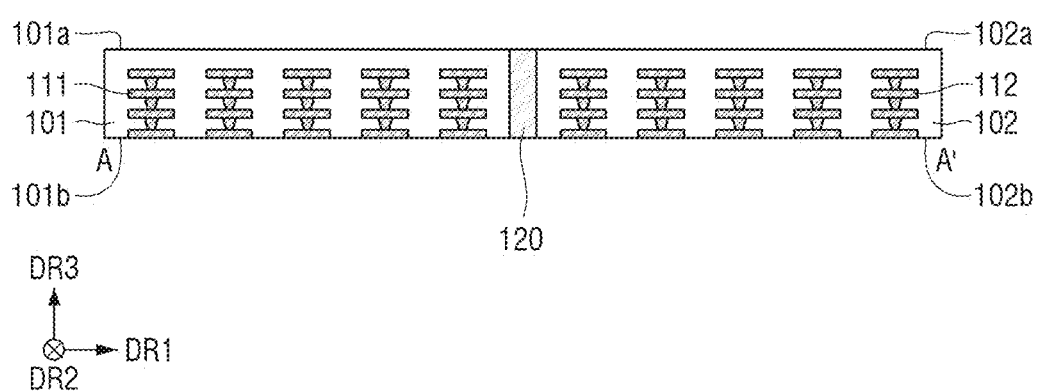
Figure 7:
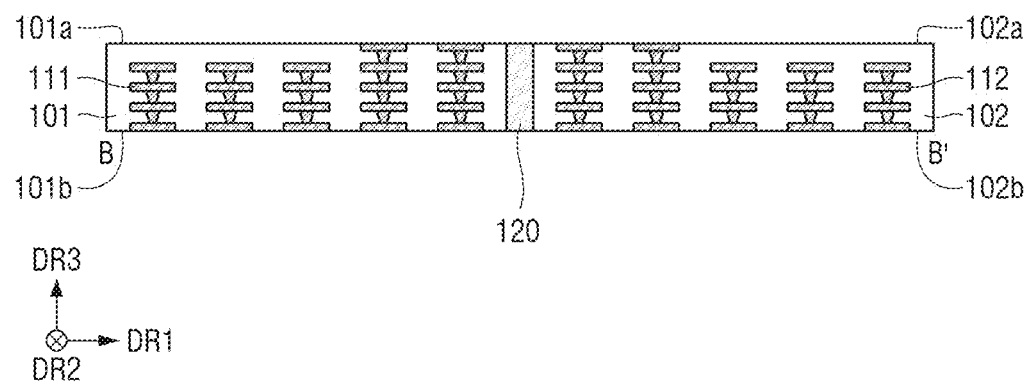

Referring to FIGS. 6 and 7, a flattening process (e.g., a CMP process) may be performed to expose each of the upper surface 101a of the first substrate 101 and the upper surface 102a of the second substrate 102. Further, the flattening process (e.g., a CMP process) may be performed to expose each of the lower surface 101b of the first substrate 101 and the lower surface 102b of the second substrate 102. Through the two flattening processes, the mold layer 120 other than the mold layer 120 formed between the first substrate 101 and the second substrate 102 may be removed.

Figure 8:
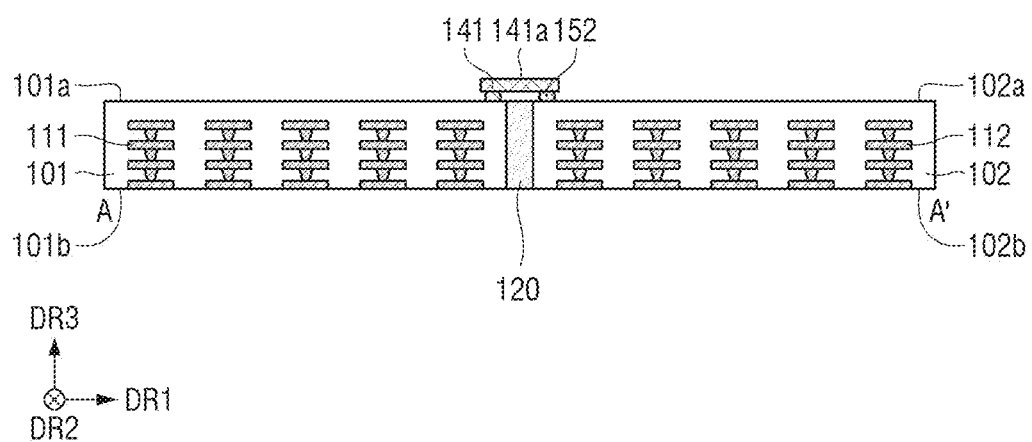
Figure 9:
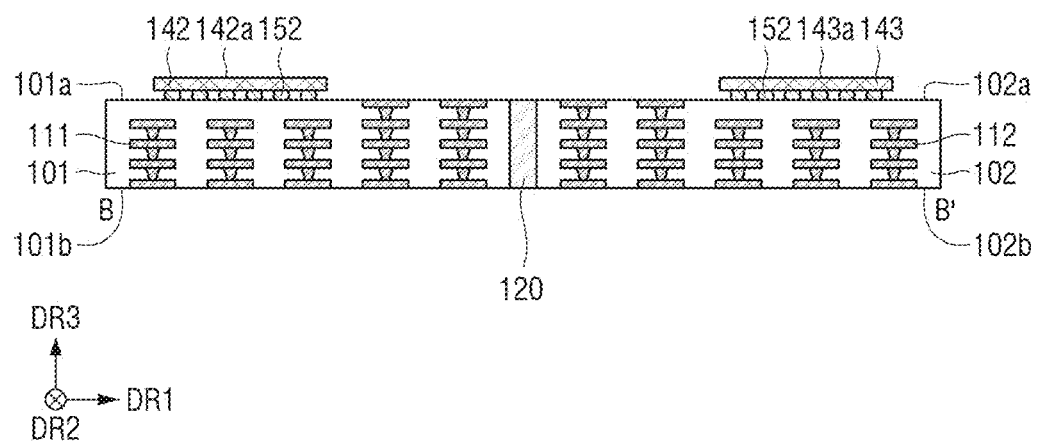

Referring to FIGS. 8 and 9, the first connecting film 141 may be formed on each of the upper surface 101a of the first substrate 101, the upper surface 102a of the second substrate 102, and the mold layer 120 disposed between the first substrate 101 and the second substrate 102. The first connecting film 141 may be attached to each of the upper surface 101a of the first substrate 101 and the upper surface 102a of the second substrate 102 through the second solder ball 152.

The second connecting film 142 may be formed on each of the upper surface 101a of the first substrate 101, the upper surface of the third substrate (e.g., 103 of FIG. 1), and the mold layer 120 disposed between the first substrate 101 and the third substrate 103. The second connecting film 142 may be attached to each of the upper surface 101a of the first substrate 101 and the upper surface of the third substrate (e.g., 103 of FIG. 1) through the second solder ball 152. Further, the third connecting film 143 may be formed on each of the upper surface 102a of the second substrate 102, the upper surface of the fourth substrate (e.g., 104 of FIG. 1), and the mold layer 120 disposed between the second substrate 102 and the fourth substrate (e.g., 104 of FIG. 1). The third connecting film 143 may be attached to each of the upper surface 101a of the first substrate 101 and the upper surface of the fourth substrate (e.g., 104 of FIG. 1) through the second solder ball 152.

Figure 10:
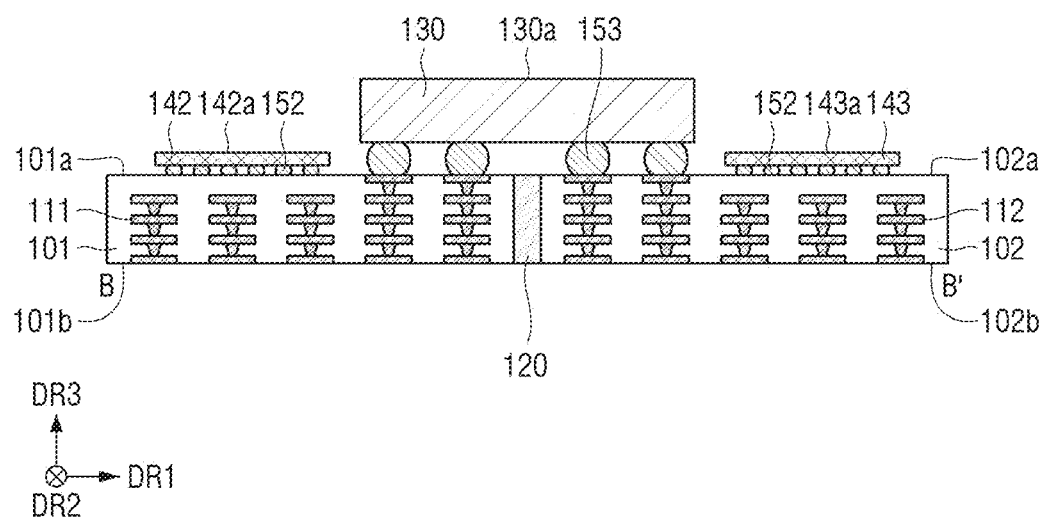

Referring to FIG. 10, the first semiconductor chip 130 may be formed on the upper surface 101a of the first substrate 101 and the upper surface 102a of the second substrate 102. The first semiconductor chip 130 may be attached to each of the upper surface 101a of the first substrate 101 and the upper surface 102a of the second substrate 102 through the third solder ball 153. For example, the first semiconductor chip 130 may be attached to each of the upper surface 101a of the first substrate 101, the upper surface 102a of the second substrate 102, the upper surface of the third substrate (e.g., 103 of FIG. 1), and the upper surface of the fourth substrate (e.g., 104 of FIG. 1).

Figure 2:
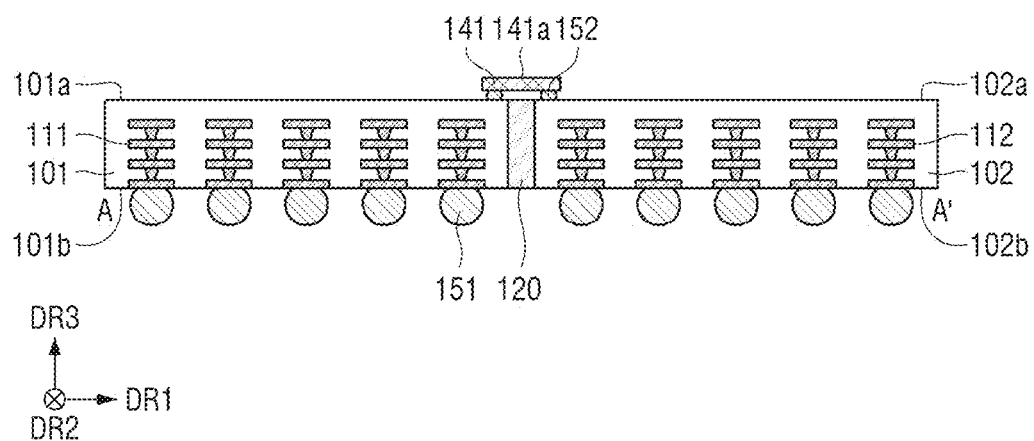
FIG. 2 is a cross-sectional view taken along a line A-A' of FIG. 1.
Figure 3:
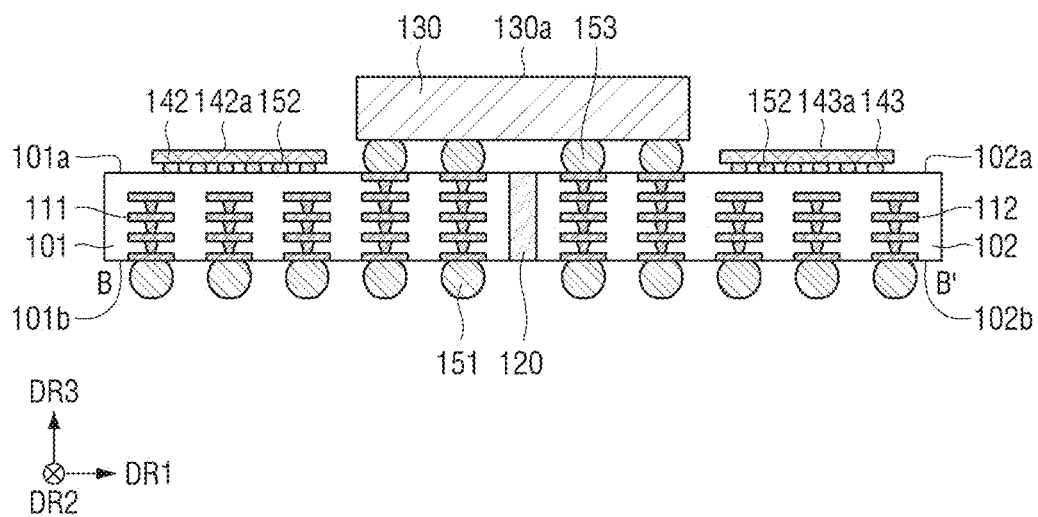
FIG. 3 is a cross-sectional view taken along a line B-B' of FIG. 1.

Referring to FIGS. 2 and 3, the first solder ball 151 may be formed on each of the lower surface 101b of the first substrate 101 and the lower surface 102b of the second substrate 102. For example, the first solder ball 151 may be formed on each of the lower surface 101b of the first substrate 101, the lower surface 102b of the second substrate 102, the lower surface of the third substrate (e.g., 103 of FIG. 1), and the lower surface of the fourth substrate (e.g., 104 of FIG. 1). Through such a manufacturing process, the semiconductor package shown in FIGS. 2 and 3 may be manufactured.

Hereinafter, a semiconductor package according to some other example embodiments of the present inventive concepts will be described referring to FIGS. 11 and 12. Differences from the semiconductor package shown in FIGS. 1 to 3 will be mainly described.

Figure 11:
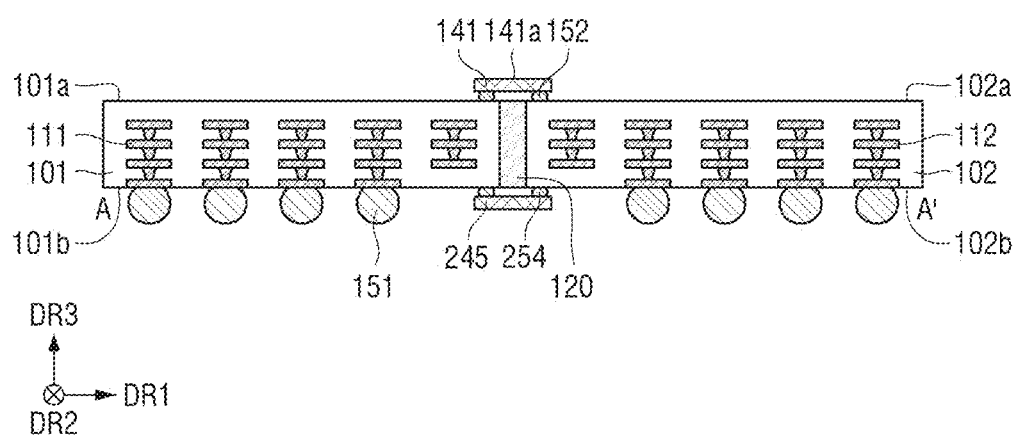
FIGS. 11 and 12 are cross-sectional views for explaining a semiconductor package according to some other example embodiments of the present inventive concepts.
Figure 12:
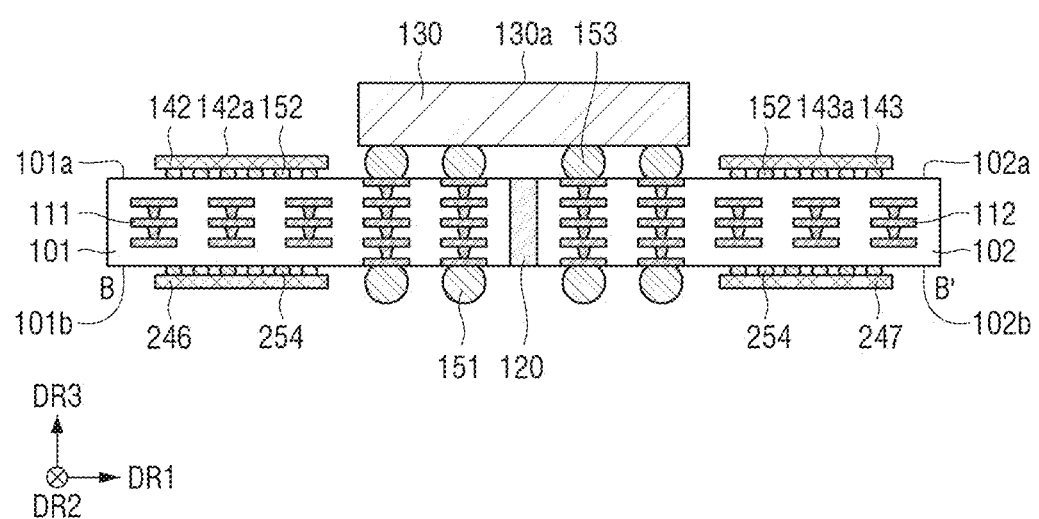

FIGS. 11 and 12 are cross-sectional views for explaining a semiconductor package according to some other example embodiments of the present inventive concepts.

Referring to FIGS. 11 and 12, in a semiconductor package according to some other example embodiments of the present inventive concepts, a fifth connecting film 245 may be disposed on the lower surface 101b of the first substrate 101 and the lower surface 102b of the second substrate 102. The fifth connecting film 245 may be connected to each of the lower surface 101b of the first substrate 101 and the lower surface 102b of the second substrate 102 through the fourth solder ball 254. For example, the fifth connecting film 245 may overlap the first connecting film 141 in the vertical direction DR3.

Further, a sixth connecting film 246 may be disposed on the lower surface 101b of the first substrate 101 and the lower surface of the third substrate (e.g., 103 of FIG. 1). The sixth connecting film 246 may be connected to each of the lower surface 101b of the first substrate 101 and the lower surface of the third substrate (e.g., 103 of FIG. 1) through the fourth solder ball 254. For example, the sixth connecting film 246 may overlap the second connecting film 142 in the vertical direction DR3.

A seventh connecting film 247 may be disposed on the lower surface 102b of the second substrate 102 and the lower surface of the fourth substrate (e.g., 104 of FIG. 1). The seventh connecting film 247 may be connected to each of the lower surface 102b of the second substrate 102 and the lower surface of the fourth substrate (e.g., 104 of FIG. 1) through the fourth solder ball 254. For example, the seventh connecting film 247 may overlap the third connecting film 143 in the vertical direction DR3.

An eighth connecting film (not shown) may be disposed on the lower surface of the third substrate (e.g., 103 of FIG. 1) and the lower surface of the fourth substrate (e.g., 104 of FIG. 1). The eighth connecting film (not shown) may be connected to each of the lower surface of the third substrate (e.g., 103 of FIG. 1) and the lower surface of the fourth substrate (e.g., 104 of FIG. 1) through the fourth solder ball 254. For example, the eighth connecting film (not shown) may overlap the fourth connecting film (e.g., 144 of FIG. 1) in the vertical direction DR3.

Hereinafter, another semiconductor package according to some other example embodiments of the present inventive concepts will be described referring to FIGS. 13 and 14. Differences from the semiconductor package shown in FIGS. 1 to 3 will be mainly described.

Figure 13:
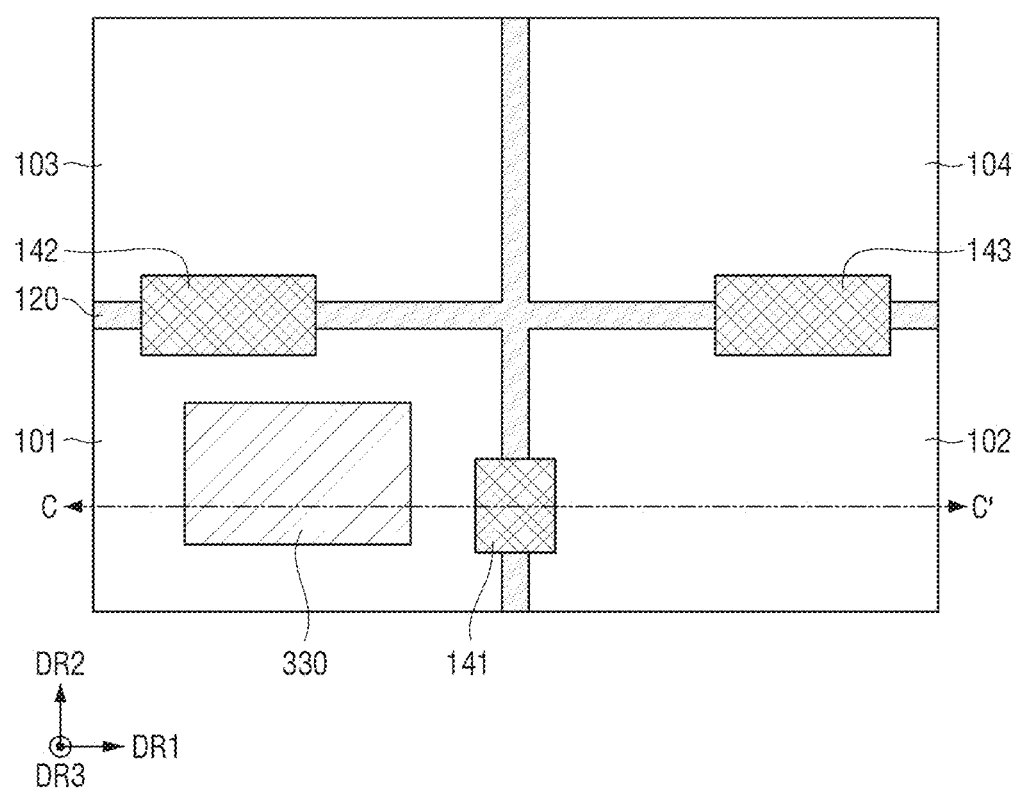
FIG. 13 is a plan view for explaining a semiconductor package according to still some other example embodiments of the present inventive concepts.

FIG. 13 is a plan view for explaining a semiconductor package according to still some other example embodiments of the present inventive concepts. FIG. 14 is a cross-sectional view taken along a line C-C' of FIG. 13.

Figure 14:
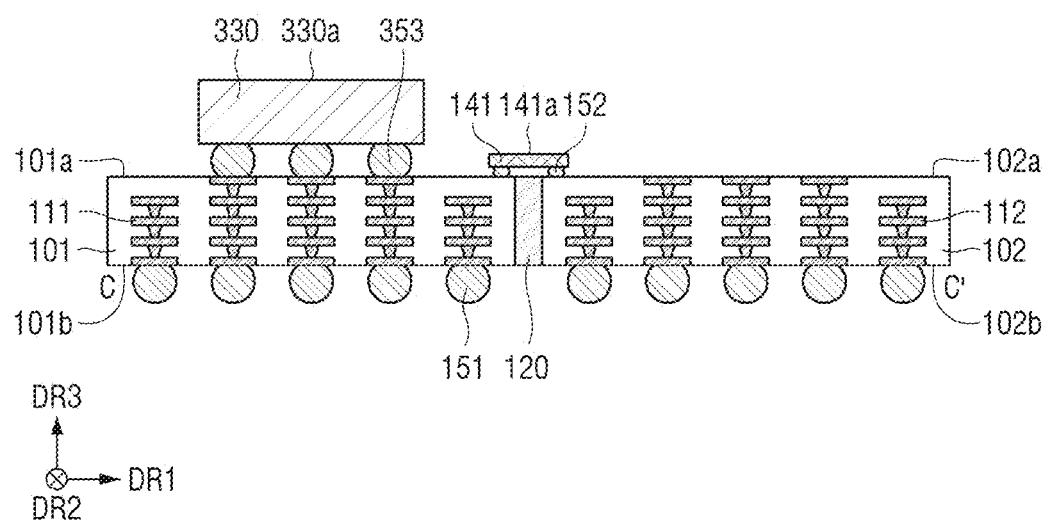
FIG. 14 is a cross-sectional view taken along a line C-C' of FIG. 13.

Referring to FIGS. 13 and 14, in the semiconductor package according to some other example embodiments of the present inventive concepts, a first semiconductor chip 330 may be disposed only on the upper surface 101a of the first substrate 101. That is, the first semiconductor chip 330 may not be disposed on the upper surface 102a of the second substrate 102, the upper surface of the third substrate 103, and the upper surface of the fourth substrate 104. The first semiconductor chip 330 may be connected to the upper surface 101a of the first substrate 101 through the third solder ball 353. The upper surface of each of the first to third connecting films 141, 142, and 143 may be formed to be lower than the upper surface 330a of the first semiconductor chip 330.

For example, a connecting film that connects the third substrate 103 and the fourth substrate 104 may not be disposed. However, example embodiments are not limited thereto. In some other example embodiments, a connecting film that connects the third substrate 103 and the fourth substrate 104 may be disposed on the upper surface of the third substrate 103 and the upper surface of the fourth substrate 104.

Hereinafter, a semiconductor package according to some other example embodiments of the present inventive concepts will be described referring to FIG. 15. Differences from the semiconductor package shown in FIGS. 1 to 3 will be mainly described.

Figure 15:
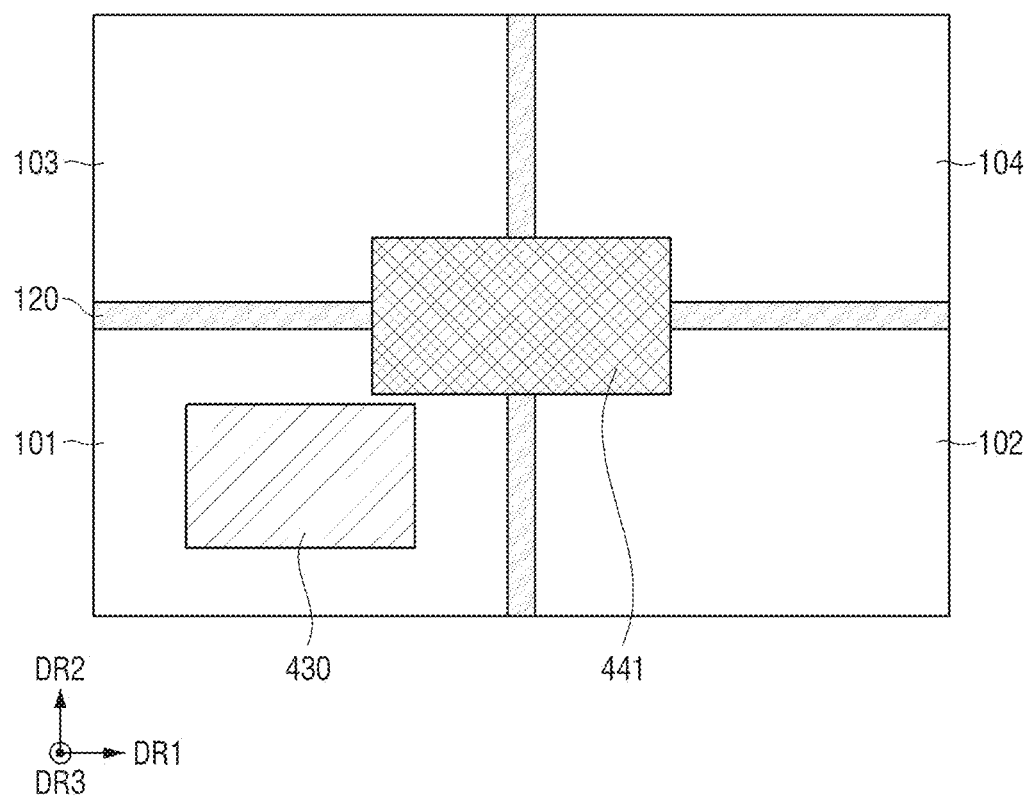
FIG. 15 is a plan view for explaining a semiconductor package according to still some other example embodiments of the present inventive concepts.

Referring to FIG. 15, in a semiconductor package according to some other example embodiments of the present inventive concepts, a first semiconductor chip 430 may be disposed only on the upper surface of the first substrate 101. That is, the first semiconductor chip 430 may not be disposed on the upper surface of the second substrate 102, the upper surface of the third substrate 103, and the upper surface of the fourth substrate 104.

A first connecting film 441 may be disposed on the upper surface of each of the first to fourth substrates 101, 102, 103 and 104. The first connecting film 441 may overlap each of the first to fourth substrates 101, 102, 103 and 104 in the vertical direction DR3. The first connecting film 441 may connect each of the first to fourth substrates 101, 102, 103 and 104 to each other.

Hereinafter, a semiconductor package according to some other example embodiments of the present inventive concepts will be described referring to FIG. 16. Differences from the semiconductor package shown in FIGS. 1 to 3 will be mainly described.

Figure 16:
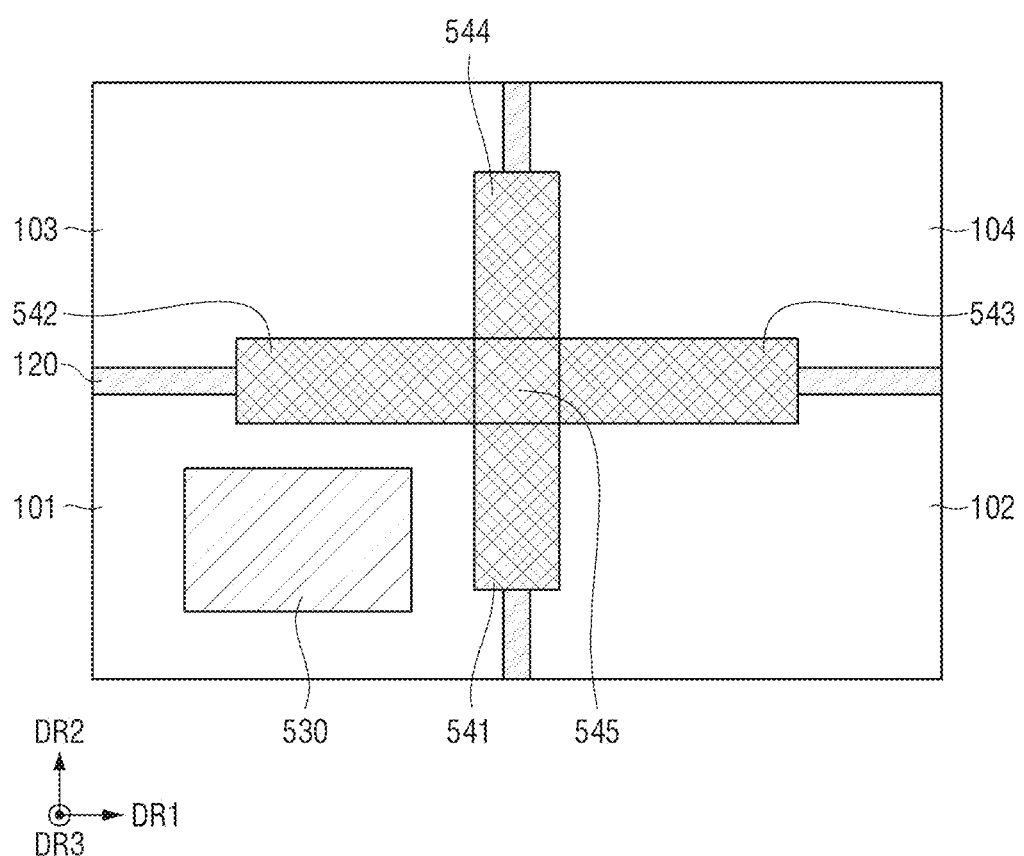
FIG. 16 is a plan view for explaining a semiconductor package according to still some other example embodiments of the present inventive concepts.

Referring to FIG. 16, in the semiconductor package according to some other example embodiments of the present inventive concepts, a first semiconductor chip 530 may be disposed only on the upper surface of the first substrate 101. That is, the first semiconductor chip 530 may not be disposed on the upper surface of the second substrate 102, the upper surface of the third substrate 103, and the upper surface of the fourth substrate 104.

A first connecting film 541 may be disposed on the upper surface of the first substrate 101 and the upper surface of the second substrate 102. The first connecting film 541 may connect the first substrate 101 and the second substrate 102. The second connecting film 542 may be disposed on the upper surface of the first substrate 101 and the upper surface of the third substrate 103. A second connecting film 542 may connect the first substrate 101 and the third substrate 103. A third connecting film 543 may be disposed on the upper surface of the second substrate 102 and the upper surface of the fourth substrate 104. The third connecting film 543 may connect the second substrate 102 and the fourth substrate 104. A fourth connecting film 544 may be disposed on the upper surface of the third substrate 103 and the upper surface of the fourth substrate 104. The fourth connecting film 544 may connect the third substrate 103 and the fourth substrate 104.

A fifth connecting film 545 may be disposed on the upper surface of each of the first to fourth substrates 101, 102, 103 and 104. The fifth connecting film 545 may overlap at least a part of each of the first to fourth substrates 101, 102, 103 and 104 in the vertical direction DR3. The fifth connecting film 545 may be disposed between the first to fourth connecting films 541, 542, 543 and 544. The fifth connecting film 545 may connect the first to fourth connecting films 541, 542, 543 and 544 to each other. For example, the planar shapes of the first to fifth connecting films 541, 542, 543 and 544, 545 may be a cross shape.

Hereinafter, a semiconductor package according to some other example embodiments of the present inventive concepts will be described referring to FIGS. 17 and 18. Differences from the semiconductor package shown in FIGS. 1 to 3 will be mainly described.

Figure 17:
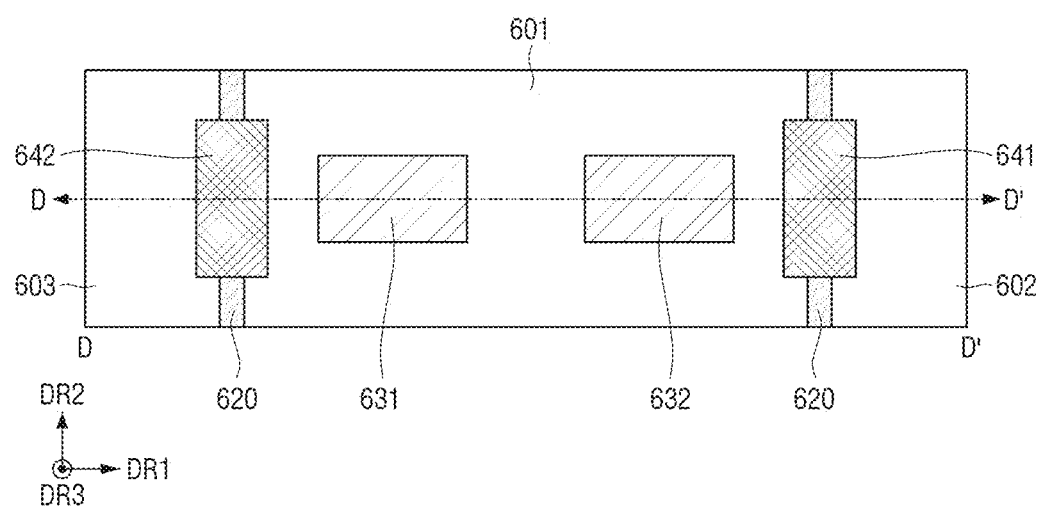
FIG. 17 is a plan view for explaining a semiconductor package according to still some other example embodiments of the present inventive concepts.

FIG. 17 is a plan view for explaining a semiconductor package according to still some other example embodiments of the present inventive concepts. FIG. 18 is a cross-sectional view taken along a line D-D' of FIG. 17.

Figure 18:
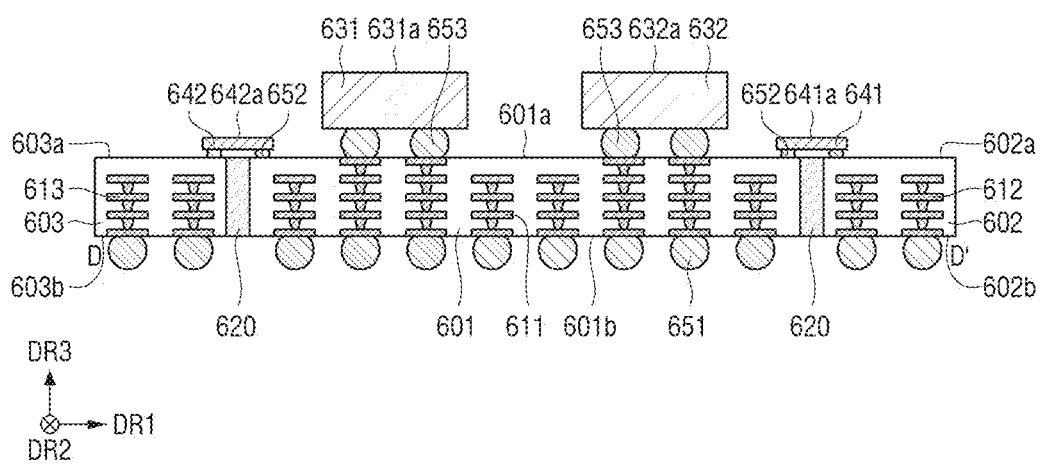
FIG. 18 is a cross-sectional view taken along a line D-D' of FIG. 17.

Referring to FIGS. 17 and 18, in a semiconductor package according to still some other example embodiments of the present inventive concepts, a third substrate 603, a first substrate 601 and a second substrate 602 may be disposed to be sequentially spaced apart from each other in the first horizontal direction DR1. That is, the second substrate 602 may be disposed on a first side of the first substrate 601, and the third substrate 603 may be disposed on a second side of the first substrate 601 opposite to the first side of the first substrate 601 in the first horizontal direction DR1.

A first wiring layer 611 may be disposed inside the first substrate 601. The second wiring layer 612 may be disposed inside the second substrate 602. A third wiring layer 613 may be disposed inside the third substrate 603. The first solder ball 651 may be disposed on the lower surfaces of each of the first to third substrates 601, 602, and 603.

A mold layer 620 may be disposed between the third substrate 603 and the first substrate 601, and between the first substrate 601 and the second substrate 602. An upper surface of the mold layer 620 may be formed on the same or substantially the same plane as each of an upper surface 601a of the first substrate 601, an upper surface 602a of the second substrate 602, and an upper surface 603a of the third substrate 603. Further, a lower surface of the mold layer 620 may be formed on the same or substantially the same plane as each of a lower surface 601b of the first substrate 601, a lower surface 602b of the second substrate 602, and a lower surface 603b of the third substrate 603.

A first semiconductor chip 631 may be disposed on the upper surface 601a of the first substrate 601. The first semiconductor chip 631 may be connected to the upper surface 601a of the first substrate 601 through a third solder ball 653. A second semiconductor chip 632 may be disposed on the upper surface 601a of the first substrate 601 to be spaced apart from the first semiconductor chip 631 in the first horizontal direction DR1. The second semiconductor chip 632 may be connected to the upper surface 601a of the first substrate 601 through the third solder ball 653. The second semiconductor chip 632 may be, for example, a logic semiconductor chip or an HBM semiconductor chip.

A first connecting film 641 may be disposed on the upper surface 601a of the first substrate 601 and the upper surface 602a of the second substrate 602. The first connecting film 641 may be connected to each of the upper surface 601a of the first substrate 601 and the upper surface 602a of the second substrate 602 through the second solder ball 652. A second connecting film 642 may be disposed on the upper surface 603a of the third substrate 603 and the upper surface 601a of the first substrate 601. The second connecting film 642 may be connected to each of the upper surface 603a of the third substrate 603 and the upper surface 601a of the first substrate 601 through the second solder ball 652.

Each of the upper surface 641a of the first connecting film 641 and the upper surface 642a of the second connecting film 642 may be formed to be lower than the upper surface 631a of the first semiconductor chip 631 and the upper surface 632a of the second semiconductor chip 632.

Hereinafter, a semiconductor package according to still some other example embodiments of the present inventive concepts will be described referring to FIGS. 19 and 20. Differences from the semiconductor package shown in FIGS. 1 to 3 will be mainly described.

Figure 19:
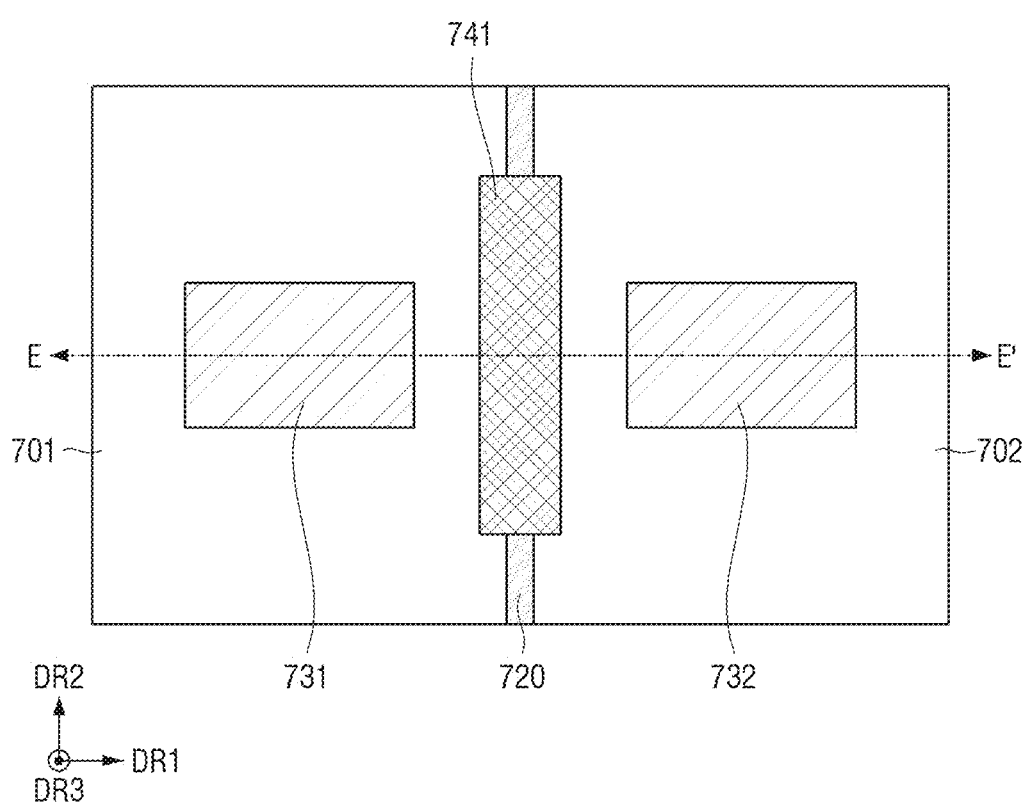
FIG. 19 is a plan view for explaining a semiconductor package according to still some other example embodiments of the present inventive concepts.

FIG. 19 is a plan view for explaining a semiconductor package according to still some other example embodiments of the present inventive concepts. FIG. 20 is a cross-sectional view taken along a line E-E' of FIG. 19.

Figure 20:
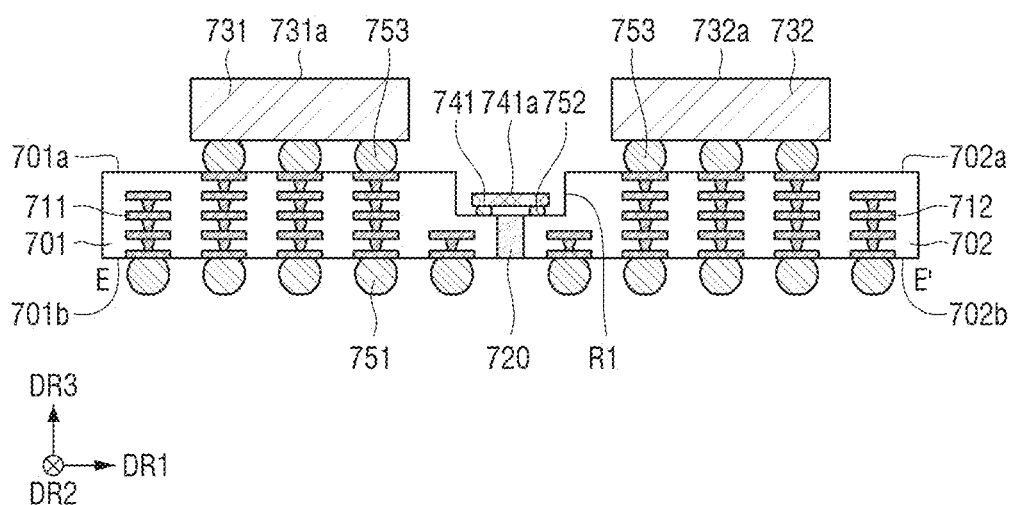
FIG. 20 is a cross-sectional view taken along a line E-E' of FIG. 19.

Referring to FIGS. 19 and 20, a semiconductor package according to still some other example embodiments of the present inventive concepts may include a first substrate 701, and a second substrate 702 spaced apart from the first substrate 701 in the first horizontal direction DR1.

A first wiring layer 711 may be disposed inside the first substrate 701. The second wiring layer 712 may be disposed inside the second substrate 702. A first solder ball 751 may be disposed on the lower surfaces of each of the first and second substrates 701 and 702.

A mold layer 720 may be disposed between the first substrate 701 and the second substrate 702. The uppermost surface of the mold layer 720 may be formed on the same or substantially the same plane as each of an uppermost surface 701a of the first substrate 701 and an uppermost surface 702a of the second substrate 702. Further, a lower surface of the mold layer 720 may be formed on the same or substantially the same plane as each of a lower surface 701b of the first substrate 701 and a lower surface 702b of the second substrate 702.

A recess R1 may be formed in a part of the first substrate 701 adjacent to the second substrate 702 and a part of the second substrate 702 adjacent to the first substrate 701. The recess R1 may also be formed in a part of the mold layer 720. A bottom surface of the recess R1 may be formed to be lower than each of the uppermost surface 701a of the first substrate 701 and the uppermost surface 702a of the second substrate 702. The upper surface of the mold layer 720 inside the recess R1 may be formed to be lower than each of the uppermost surface 701a of the first substrate 701 and the uppermost surface 702a of the second substrate 702.

A first semiconductor chip 731 may be disposed on the uppermost surface 701a of the first substrate 701. The first semiconductor chip 731 may be connected to the uppermost surface 701a of the first substrate 701 through a third solder ball 753. A second semiconductor chip 732 may be disposed on the uppermost surface 702a of the second substrate 702. The second semiconductor chip 732 may be connected to the uppermost surface 702a of the second substrate 702 through the third solder ball 753. The second semiconductor chip 732 may be, for example, a logic semiconductor chip or an HBM semiconductor chip.

A first connecting film 741 may be disposed inside the recess R1. The first connecting film 741 may be connected to each of the first substrate 701 and the second substrate 702 through a second solder ball 752 inside the recess R1. The first connecting film 741 may overlap the mold layer 720 inside the recess R1 in the vertical direction DR3. An upper surface 741a of the first connecting film 741 may be formed to be lower than each of the upper surface 731a of the first semiconductor chip 731 and the upper surface 732a of the second semiconductor chip 732. The upper surface 741a of the first connecting film 741 may be formed to be lower than each of the uppermost surface 701a of the first substrate 701 and the uppermost surface 702a of the second substrate 702.

Hereinafter, a semiconductor package according to still some other embodiments of the present disclosure will be described referring to FIGS. 19 and 21. Difference from the semiconductor package shown in FIG. 20 will be mainly described.

FIG. 19 is a plan view for explaining a semiconductor package according to still some other example embodiments of the present inventive concepts. FIG. 21 is a cross-sectional view taken along a line E-E' of FIG. 19 for explaining a semiconductor package according to some other example embodiments of the present inventive concepts.

Figure 21:
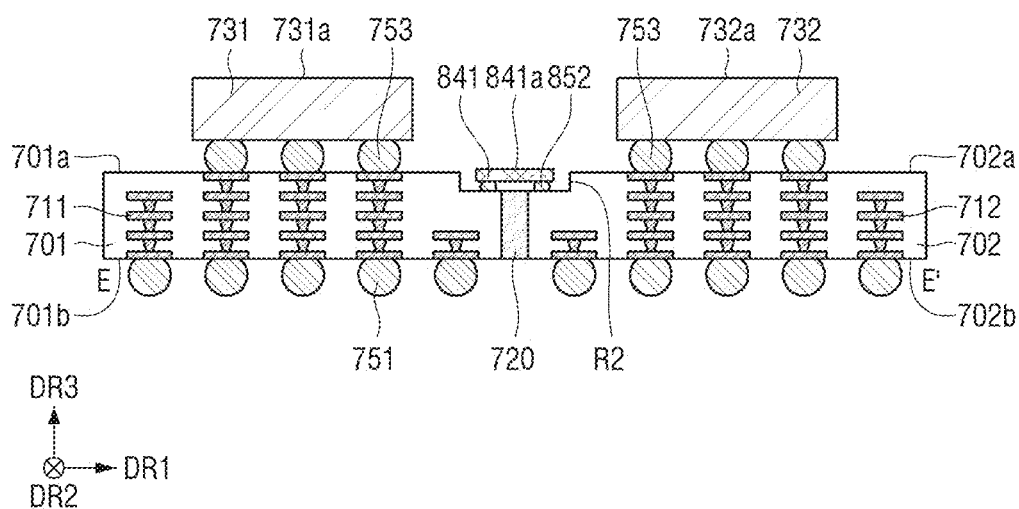
FIG. 21 is a cross-sectional view taken along a line E-E' of FIG. 19 for explaining a semiconductor package according to some other example embodiments of the present inventive concepts.

Referring to FIGS. 19 and 21, in a semiconductor package according to still some other example embodiments of the present inventive concepts, an upper surface 841a of a first connecting film 841 disposed inside a recess R2 may be formed to be higher than each of the uppermost surface 701a of the first substrate 701 and the uppermost surface 702a of the second substrate 702. The first connecting film 741 may be connected to each of the first substrate 701 and the second substrate 702 through the second solder ball 852 inside the recess R2.

Hereinafter, a semiconductor package according to still some other example embodiments of the present inventive concepts will be described referring to FIGS. 22 and 23. Differences from the semiconductor package shown in FIGS. 17 and 18 will be mainly described.

Figure 22:
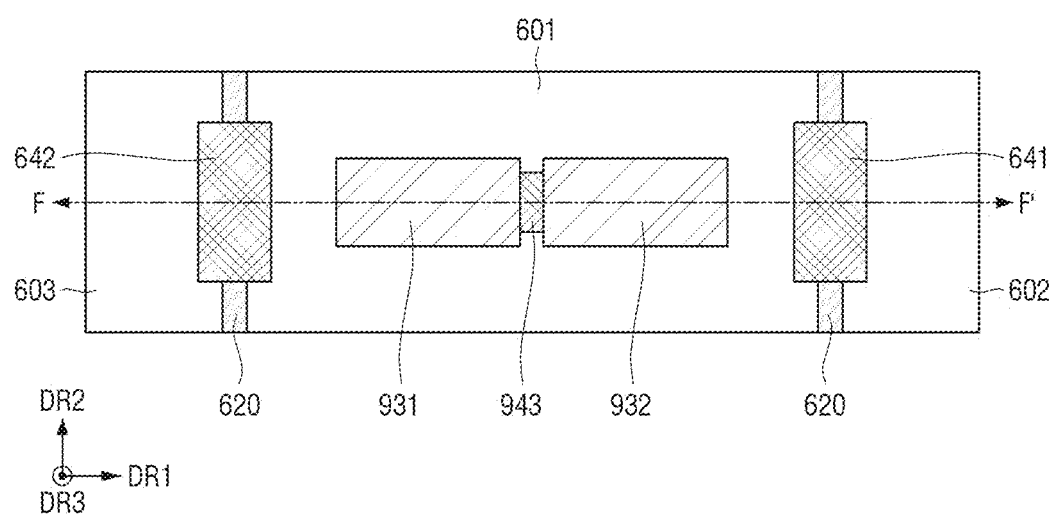
FIG. 22 is a plan view for explaining a semiconductor package according to still some other example embodiments of the present inventive concepts.

FIG. 22 is a plan view for explaining a semiconductor package according to still some other example embodiments of the present inventive concepts. FIG. 23 is a cross-sectional view taken along a line F-F' of FIG. 22.

Figure 23:
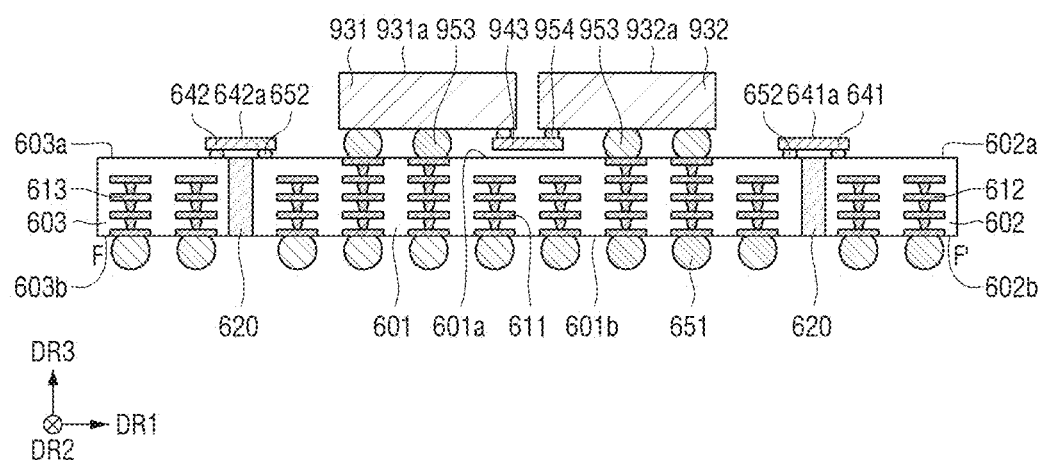
FIG. 23 is a cross-sectional view taken along a line F-F' of FIG. 22.

Referring to FIGS. 22 and 23, in a semiconductor package according to still some other example embodiments of the present inventive concepts, a third connecting film 943 that connects a first semiconductor chip 931 and a second semiconductor chip 932 may be disposed on the upper surface 601a of the first substrate 601.

The first semiconductor chip 931 may be disposed on the upper surface 601a of the first substrate 601. The first semiconductor chip 931 may be connected to the upper surface 601a of the first substrate 601 through a third solder ball 953. The second semiconductor chip 932 may be disposed on the upper surface 601a of the first substrate 601 to be spaced apart from the first semiconductor chip 931 in the first horizontal direction DR1. The second semiconductor chip 932 may be connected to the upper surface 601a of the first substrate 601 through the third solder ball 953. The second semiconductor chip 932 may be, for example, a logic semiconductor chip or an HBM semiconductor chip.

The third connecting film 943 may be disposed on a lower surface of the first semiconductor chip 931 and a lower surface of the second semiconductor chip 932. The third connecting film 943 may be connected to each of the lower surface of the first semiconductor chip 931 and the lower surface of the second semiconductor chip 932 through a fourth solder ball 954. The third connecting film 943 may be disposed between a fourth solder ball 954 connected to the lower surface of the first semiconductor chip 931 and the fourth solder ball 954 connected to the lower surface of the second semiconductor chip 932. Each of the upper surface 641a of the first connecting film 641 and the upper surface 642a of the second connecting film 642 may be formed to be lower than each of the upper surface 931a of the first semiconductor chip 931 and the upper surface 932a of the second semiconductor chip 932.

The third connecting film 943 may include a conductive material. In this case, the first semiconductor chip 931 and the second semiconductor chip 932 may be electrically connected through the third connecting film 943. However, example embodiments are not limited thereto. In some other example embodiments, the third connecting film 943 may include an insulating material. In this case, the third connecting film 943 may physically connect the first semiconductor chip 931 and the second semiconductor chip 932, and physically insulate the first semiconductor chip 931 and the second semiconductor chip 932.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of +10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., +10%) around the stated elements and/or properties thereof.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
    a first substrate including a first wiring layer inside the first substrate;
    a second substrate including a second wiring layer inside the second substrate, the second substrate spaced apart from the first substrate in a first horizontal direction;
    a mold layer between the first substrate and the second substrate, an upper surface of the mold layer on a same plane as each of an upper surface of the first substrate and an upper surface of the second substrate;
    a first connecting film on each of the upper surface of the first substrate and the upper surface of the second substrate, the first connecting film connecting the first substrate and the second substrate; and
    a first semiconductor chip on the upper surface of the first substrate, the first semiconductor chip spaced apart from the first connecting film, and
    an upper surface of the first connecting film lower than an upper surface of the first semiconductor chip.

2. The semiconductor package of claim 1, further comprising:
    a third substrate including a third wiring layer inside the third substrate, the third substrate spaced apart from the first substrate in a second horizontal direction, the second horizontal direction different from the first horizontal direction;
    a fourth substrate including a fourth wiring layer inside the fourth substrate, the fourth substrate spaced apart from the second substrate in the second horizontal direction;
    a second connecting film on each of the upper surface of the first substrate and an upper surface of the third substrate, the second connecting film connecting the first substrate and the third substrate; and
    a third connecting film on each of the upper surface of the second substrate and an upper surface of the fourth substrate, the third connecting film connecting the second substrate and the fourth substrate.

3. The semiconductor package of claim 2, further comprising:
    a fourth connecting film on each of the upper surface of the third substrate and the upper surface of the fourth substrate, the fourth connecting film connecting the third substrate and the fourth substrate.

4. The semiconductor package of claim 1, further comprising:
    a second connecting film on each of a lower surface of the first substrate and a lower surface of the second substrate, the second connecting film connecting the first substrate and the second substrate, the second connecting film overlapping the first connecting film in a vertical direction, the vertical direction perpendicular to the first horizontal direction.

5. The semiconductor package of claim 1, wherein a lower surface of the mold layer is on a same plane as each of a lower surface of the first substrate and a lower surface of the second substrate.

6. The semiconductor package of claim 1, wherein the first semiconductor chip overlaps each of the upper surface of the first substrate and the upper surface of the second substrate in a vertical direction, the vertical direction perpendicular to the first horizontal direction.

7. The semiconductor package of claim 1, further comprising:
    a third substrate including a third wiring layer inside the third substrate, the third substrate spaced apart from the first substrate in a second horizontal direction, the second horizontal direction different from the first horizontal direction; and
    a fourth substrate including a fourth wiring layer inside the fourth substrate, the fourth substrate spaced apart from the second substrate in the second horizontal direction,
    wherein the first connecting film overlaps each of the first to fourth substrates in a vertical direction, the vertical direction perpendicular to the first and second horizontal directions, the first connecting film connecting the first to fourth substrates to each other.

8. The semiconductor package of claim 1, further comprising:
    a third substrate including a third wiring layer inside the third substrate, the second substrate on a first side of the first substrate, the third substrate on a second side of the first substrate, and the second side of the first substrate opposite to the first side of the first substrate in the first horizontal direction; and a second connecting film on each of the upper surface of the first substrate and an upper surface of the third substrate, the second connecting film connecting the first substrate and the third substrate.

9. The semiconductor package of claim 8, further comprising:
a second semiconductor chip which on the upper surface of the first substrate, the second semiconductor chip spaced apart from the first semiconductor chip; and
a third connecting film on a lower surface of the first semiconductor chip and a lower surface of the second semiconductor chip, the third connecting film connecting the first semiconductor chip and the second semiconductor chip.

10. The semiconductor package of claim 1, further comprising:
a second semiconductor chip on the upper surface of the second substrate, the second semiconductor chip spaced apart from the first connecting film; and
a recess defined in a part of the first substrate adjacent to the second substrate and a part of the second substrate adjacent to the first substrate, the recess defining a bottom surface lower than each of an uppermost surface of the first substrate and an uppermost surface of the second substrate,
wherein at least a part of the first connecting film is inside the recess.

11. The semiconductor package of claim 10, wherein the upper surface of the first connecting film is lower than the uppermost surface of the first substrate and the uppermost surface of the second substrate.

12. The semiconductor package of claim 10, wherein the upper surface of the first connecting film is higher than each of the uppermost surface of the first substrate and the uppermost surface of the second substrate.

13. A semiconductor package comprising:
a first substrate including a first wiring layer inside the first substrate;
a second substrate including a second wiring layer inside the second substrate, the second substrate spaced apart from the first substrate in a first horizontal direction;
a third substrate including a third wiring layer inside the third substrate, the third substrate spaced apart from the first substrate in a second horizontal direction, the second horizontal direction different from the first horizontal direction;
a fourth substrate including a fourth wiring layer inside the fourth substrate, the fourth substrate spaced apart from the second substrate in the second horizontal direction;
a mold layer between each of the first to fourth substrates;
a first connecting film on each of an upper surface of the first substrate and an upper surface of the second substrate, the first connecting film connecting the first substrate and the second substrate;
a second connecting film on each of the upper surface of the first substrate and an upper surface of the third substrate, the second connecting film connecting the first substrate and the third substrate;
a third connecting film on each of the upper surface of the second substrate and an upper surface of the fourth substrate, the third connecting film connecting the second substrate and the fourth substrate; and
a semiconductor chip on at least one of the upper surfaces of the first to fourth substrates, the semiconductor chip spaced apart from each of the first to third connecting films,
wherein an upper surface of the mold layer is on a same plane as the upper surfaces of each of the first to fourth substrates.

14. The semiconductor package of claim 13, wherein upper surfaces of each of the first to third connecting films are lower than an upper surface of the semiconductor chip.

15. The semiconductor package of claim 13, further comprising:
a fifth connecting film on each of a lower surface of the first substrate and a lower surface of the second substrate, the fifth connecting film connecting the first substrate and the second substrate;
a sixth connecting film on each of the lower surface of the first substrate and a lower surface of the third substrate, the sixth connecting film connecting the first substrate and the third substrate; and
a seventh connecting film on each of the lower surface of the second substrate and a lower surface of the fourth substrate, the seventh connecting film connecting the second substrate and the fourth substrate.

16. The semiconductor package of claim 15, wherein
the fifth connecting film overlaps the first connecting film in a vertical direction, the vertical direction perpendicular to the first and second horizontal directions,
the sixth connecting film overlaps the second connecting film in the vertical direction, and
the seventh connecting film overlaps the third connecting film in the vertical direction.

17. The semiconductor package of claim 13, further comprising:
a fourth connecting film on each of the upper surface of the third substrate and the upper surface of the fourth substrate, the fourth connecting film connecting the third substrate and the fourth substrate; and
a fifth connecting film connecting the first to fourth connecting films to each other.

18. A semiconductor package comprising:
a first substrate including a first wiring layer inside the first substrate;
a second substrate including a second wiring layer inside the second substrate, the second substrate spaced apart from the first substrate;
a third substrate including a third wiring layer inside the third substrate, the third substrate spaced apart from each of the first and second substrates;
a mold layer between each of the first to third substrates, the mold layer including an upper surface on a same plane as upper surfaces of each of the first to third substrates;
a first connecting film on each of the upper surface of the first substrate, the upper surface of the mold layer and the upper surface of the second substrate, the first connecting film connecting the first substrate and the second substrate; and
a second connecting film on each of the upper surface of the first substrate, the upper surface of the mold layer and the upper surface of the third substrate, the second connecting film connecting the first substrate and the third substrate.

19. The semiconductor package of claim 18, wherein a lower surface of the mold layer is on a same plane as lower surfaces of each of the first to third substrates.

20. The semiconductor package of claim 18, further comprising:
- a semiconductor chip at least partially on the upper surface of the first substrate, the semiconductor chip spaced apart from each of the first and second connecting films,
- wherein an upper surface of the first connecting film and an upper surface of the second connecting film are each lower than an upper surface of the semiconductor chip.

* * * * *